(12) United States Patent
Mitsuyoshi et al.

(10) Patent No.: US 10,040,102 B2
(45) Date of Patent: Aug. 7, 2018

(54) SUBSTRATE PROCESSING METHOD

(71) Applicant: DAINIPPON SCREEN MFG. CO., LTD., Kyoto (JP)

(72) Inventors: Ichiro Mitsuyoshi, Kyoto (JP); Jun Shibukawa, Kyoto (JP); Shinji Kiyokawa, Kyoto (JP); Tomohiro Kurebayashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 775 days.

(21) Appl. No.: 14/223,391

(22) Filed: Mar. 24, 2014

(65) Prior Publication Data

US 2014/0202499 A1   Jul. 24, 2014

Related U.S. Application Data

(62) Division of application No. 11/958,891, filed on Dec. 18, 2007, now abandoned.

(30) Foreign Application Priority Data

Dec. 27, 2006  (JP) .................. 2006-351999

(51) Int. Cl.
   *B08B 3/04*    (2006.01)
   *H01L 21/67*   (2006.01)
   *H01L 21/677*  (2006.01)

(52) U.S. Cl.
   CPC .......... *B08B 3/04* (2013.01); *H01L 21/67201* (2013.01); *H01L 21/67742* (2013.01);
   (Continued)

(58) Field of Classification Search
   USPC ....................................... 134/25.1
   See application file for complete search history.

(56) References Cited

U.S. PATENT DOCUMENTS

| 5,024,744 A | 6/1991 | Okabayashi ............ 204/194 |
| 5,498,294 A | 3/1996 | Matsushita et al. ........ 134/6 |

(Continued)

FOREIGN PATENT DOCUMENTS

| CN | 1685080 | 10/2005 |
| JP | 10-321692 | 12/1998 |

(Continued)

OTHER PUBLICATIONS

Related to U.S. Appl. No. 11/959,085, filed Dec. 18, 2007.
Related to U.S. Appl. No. 11/958,996, filed Dec. 18, 2007.
Related to U.S. Appl. No. 11/958,816, filed Dec. 18, 2007.

*Primary Examiner* — Katelyn B Whatley
(74) *Attorney, Agent, or Firm* — Ostrolenk Faber LLP

(57) ABSTRACT

A substrate processing apparatus has an indexer block and a processing block. One side of the processing block has a vertical stack of a plurality of top surface cleaning units and the other side of the processing block has a vertical stack of a plurality of back surface cleaning units. Reversing units for reversing the substrate W are provided one above the other between the indexer block and the processing block. For example, one reversing unit is used for reversing the substrate before a back surface cleaning processing by the back surface cleaning unit or for other purposes, and the other reversing unit is used for placing the substrate W after a top surface cleaning processing by the top surface cleaning unit or for other purposes.

7 Claims, 11 Drawing Sheets

(52) U.S. Cl.
CPC .. *H01L 21/67754* (2013.01); *H01L 21/67766* (2013.01); *H01L 21/67781* (2013.01)

(56) References Cited

U.S. PATENT DOCUMENTS

| | | | |
|---|---|---|---|
| 5,518,542 A | 5/1996 | Matsukawa et al. | 118/52 |
| 5,989,346 A * | 11/1999 | Hiroki | C23C 14/566 118/719 |
| 6,068,002 A | 5/2000 | Kamikawa et al. | 134/66 |
| 6,299,696 B2 | 10/2001 | Kamikawa et al. | 134/2 |
| 6,874,515 B2 | 4/2005 | Ishihara et al. | 134/140 |
| 6,893,171 B2 | 5/2005 | Fukutomi et al. | 396/611 |
| 2001/0049204 A1 | 12/2001 | Kuroda | 438/784 |
| 2002/0059686 A1* | 5/2002 | Uemukai | B08B 1/04 15/77 |
| 2002/0157692 A1 | 10/2002 | Ishihara et al. | 134/134 |
| 2004/0055707 A1 | 3/2004 | Sato et al. | 156/345.11 |
| 2005/0022325 A1 | 2/2005 | Uemukai et al. | 15/77 |
| 2005/0072358 A1 | 4/2005 | Katsuoka et al. | 118/719 |
| 2006/0008342 A1* | 1/2006 | Putzi | H01L 21/67173 414/222.01 |
| 2006/0045722 A1 | 3/2006 | Hashimoto | 414/754 |
| 2006/0091005 A1 | 5/2006 | Toma et al. | 204/290.11 |
| 2006/0182529 A1 | 8/2006 | Hiroki | 414/217 |
| 2006/0236929 A1 | 10/2006 | Katsuoka et al. | 118/412 |
| 2006/0243204 A1 | 11/2006 | Katsuoka et al. | 118/423 |
| 2006/0243205 A1 | 11/2006 | Katsuoka et al. | 118/423 |

FOREIGN PATENT DOCUMENTS

| | | |
|---|---|---|
| JP | 11-309408 | 11/1999 |
| JP | 2002-110609 | 4/2002 |
| JP | 2004-146708 | 5/2004 |
| JP | 2004-241552 | 8/2004 |
| JP | 2004-327674 | 11/2004 |
| JP | 2004327674 A * | 11/2004 |
| KR | 10-2003-0012104 | 2/2003 |

* cited by examiner

SUBSTRATE PROCESSING METHOD

CROSS-REFERENCE TO RELATED APPLICATIONS

This application is a divisional of U.S. patent application Ser. No. 11/958,891, filed Dec. 18, 2007, incorporated herein by reference, which claims the benefit of Japanese Patent Application No. 2006-351999, filed Dec. 27, 2006, incorporated herein by reference.

FIELD OF THE INVENTION

The present invention relates to a substrate processing apparatus and a substrate processing method for subjecting a substrate to processing.

DESCRIPTION OF THE BACKGROUND ART

Substrate processing apparatuses have been conventionally used to perform various types of processes on substrates such as semiconductor wafers, glass substrates for photomasks, glass substrates for liquid crystal displays, glass substrates for optical disks or the like.

For example, the substrate processing apparatus including a reversing unit that reverses a top surface and a back surface of the substrate is described in JP 2004-146708 A. In such a substrate processing apparatus, a center robot (transport unit) that transports the substrate is arranged in substantially the center of a processing section having a rectangular shape.

In the processing section, a plurality of (four, for example) back surface cleaning units that perform cleaning processes on the back surfaces of the substrates, respectively, are arranged so as to surround the center robot. In addition, are arranged so as to surround the center robot. In addition, the reversing unit is arranged in a position where the center robot can access in the processing section.

An indexer section including a plurality of storing containers that store the substrates is provided on one end of the processing section. A substrate transport robot that takes the substrate before processing out of the above-mentioned storing container or stores the substrate after the processing in the above-mentioned storing container is provided in this indexer section.

In the above-described configuration, the substrate transport robot takes the substrate before the processing out of any of the storing containers and transfers it to the center robot while receiving the substrate after the processing from the center robot and storing it in the storing container.

The center robot receives the substrate before the processing from the substrate transport robot and subsequently transfers the received substrate to the reversing unit. The reversing unit reverses the substrate received from the center robot so that the top surface thereof is directed downward. Then, the center robot receives the substrate reversed by the reversing unit and carries the substrate to any of the back surface cleaning units.

Next, when the processing is finished in any of the back surface cleaning units described above, the center robot carries the substrate out of the back surface cleaning unit and again transfers it to the reversing unit. The reversing unit reverses the substrate that has been subjected to the processing in the back surface cleaning unit so that the top surface thereof is directed upward.

The center robot subsequently receives the substrate reversed by the reversing unit and transfers it to the substrate transport robot. The substrate transport robot receives the substrate after the processing from the center robot and stores it in the storing container.

As described above, the substrate before the processing stored in the storing container is reversed by the reversing unit and subjected to the processing (processing to the back surface of the substrate) in the back surface cleaning unit, and subsequently reversed again by the reversing unit and stored in the storing container as the substrate after the processing.

However, many transporting processes are performed by the center robot in the configuration of the conventional substrate processing apparatus described above. Specifically, the center robot is required to perform four transporting processes for the single substrate, that is, a transporting process from the substrate transport robot to the reversing unit, a transporting process from the reversing unit to the back surface cleaning unit, a transporting process from the back surface cleaning unit to the reversing unit and a transporting process from the reversing unit to the substrate transport robot.

Many transporting processes by the center robot among the substrate transport robot, the reversing unit and the plurality of back surface cleaning units described above reduce the throughput of the substrate processing.

Moreover, when cleaning processing of the back surface of the substrate and cleaning processing of the top surface of the substrate are performed in the substrate processing apparatus, a plurality of top surface cleaning units are arranged in the processing section instead of part of the back surface cleaning units.

In such a configuration, the center robot is required to perform five transporting processes for the single substrate, that is, the transporting process from the substrate transport robot to the reversing unit, the transporting process from the reversing unit to the back surface cleaning unit, the transporting process from the back surface cleaning unit to the reversing unit, a transporting process from the reversing unit to the top surface cleaning unit and a transporting process from the top surface cleaning unit to the substrate transport robot.

Also in this case, many transporting processes by the center robot among the substrate transport robot, the reversing unit, the plurality of back surface cleaning units and the plurality of top surface cleaning units reduce the throughput of the substrate processing.

SUMMARY OF THE INVENTION

It is an object of the present invention to provide a substrate processing apparatus and a substrate processing method capable of improving the throughput of the substrate processing.

(1) According to an aspect of the present invention, a substrate processing apparatus that performs processing on a substrate having a top surface and a back surface includes a processing region for processing the substrate, a carrying in and out region for carrying the substrate into and out of the processing region and first and second reversing devices that are provided between the processing region and the carrying in and out region and reverse the top surface and the back surface of the substrate, wherein the carrying in and out region includes a container platform where a storing container that stores the substrate is placed and a first transport device that transports the substrate between the storing container placed on the container platform and any of the first and second reversing devices, the processing region includes a processing unit that performs processing on the substrate and a second transport device that transports the substrate between any of the first and second reversing devices and the processing unit, the first reversing device is used in transfer of the substrate from the first transport device to the second transport device and the second reversing device is used in transfer of the substrate from the second transport device to the first transport device.

In the substrate processing apparatus, the substrate is stored in the storing container placed on the container platform in the carrying in and out region. The first and second reversing devices that reverse the top surface and the back surface of the substrate are provided between the processing region and the carrying in and out region.

The substrate is transported by the first transport device in the carrying in and out region between the above-mentioned storing container and any of the first and second reversing devices. In addition, the substrate is transported by the second transport device in the processing region between any of the first and second reversing devices and the processing unit. The substrate is processed in the processing region.

The above-mentioned first reversing device is used in transfer of the substrate from the first transport device to the second transport device, and the second reversing device is used in transfer of the substrate from the second transport device to the first transport device.

As described above, the first and second reversing devices are provided between the processing region and the carrying in and out region, so that the transporting process by the second transport device between the first transport device and the first and second reversing devices can be eliminated. Thus, the number of the transporting processes for the single substrate by the second transport device is reduced. This improves the throughput of the substrate processing.

Moreover, since the first reversing device is used in transfer of the substrate from the first transport device to the second transport device, that is, in transfer of the substrate before the processing, and the second reversing device is used in transfer of the substrate from the second transport device to the first transport device, that is, in transfer of the substrate after the processing, the substrate after the processing is prevented from being contaminated by the substrate before the processing when being received and transferred between the first transport device and the second transport device.

In addition, the first and second reversing devices are provided between the processing region and the carrying in and out region, so that the configuration of the existing substrate processing apparatus (a configuration of a so-called platform) is not required to be changed. Thus, an increase in production cost of the substrate processing apparatus can be suppressed. Moreover, providing the first and second reversing devices does not increase the footprint of the substrate processing apparatus or prevent the substrate processing apparatus from being reduced in size.

Furthermore, the first and second reversing devices function as interfaces, so that the production cost of the substrate processing apparatus can be further reduced.

(2) Each of the first and second reversing devices may reverse the substrate around a rotation axis that crosses a line connecting a position of the first transport device in receiving and transferring the substrate and a position of the second transport device in receiving and transferring the substrate.

In this case, the first and second reversing devices can transfer and receive the substrate to and from the first and second transport devices without changing their directions. Thus, the configurations of the first and second reversing devices are simplified while the cost can be reduced. In addition, the directions of the first and second reversing devices are not required to be changed, so that the throughput of the substrate processing is improved.

(3) Each of the first and second reversing devices may include a first holding mechanism that holds the substrate vertically to a first axis, a second holding mechanism that holds the substrate vertically to the first axis, a support member that supports the first and second holding mechanisms so that the first and second holding mechanisms overlap with each other in a direction of the first axis and a rotating device that integrally rotates the support member together with the first and second holding mechanisms around a second axis that is substantially vertical to the first axis.

In this case, the substrate is held vertically to the first axis by at least one of the first and second holding mechanisms. In the state, the first and second holding mechanisms are integrally rotated around the second axis that is substantially vertical to the first axis by the rotating device. Accordingly, the substrate held by the first holding mechanism or the second holding mechanism is reversed.

Here, when the above-mentioned first and second transport devices have the two transport holders, respectively, and the substrate is carried into and out of the first or second reversing device by using the two transport holders, the substrate after the reversing can be carried out of one of the first and second holding mechanisms by one of the two transport holders and the substrate before the reversing can be carried into the other of the first and second holding mechanisms by the other of the two transport holders.

In such a case, the first and second holding mechanisms are supported so as to overlap with each other in the direction of the first axis. Therefore, the two transport holders are arranged so as to overlap with each other in the direction parallel to the first axis, so that the substrate can be carried into and out of the first and second holding mechanisms by hardly moving the two transport holders in the direction parallel to the first axis. This allows the substrate to be quickly carried into and out of the first and second reversing devices.

Moreover, the two transport holders are arranged so as to overlap with each other in the direction parallel to the first axis, so that the two substrates can be simultaneously carried into the first and second holding mechanisms by the two transport holders while the two substrates can be simultaneously carried out of the first and second holding mechanisms by the two transport holders. Accordingly, the substrate can be quickly carried into and out of the first and second reversing devices while the plurality of substrates can be efficiently reversed.

(4) The first and second holding mechanisms may include a common reverse holding member having one surface and the other surface that are vertical to the first axis, the first holding mechanism may include a plurality of first supporters that are provided on the one surface of the common reverse holding member and support a periphery of the substrate, a first reverse holding member provided so as to face the one surface of the common reverse holding member, a plurality of second supporters that are provided on a surface, which faces the common reverse holding member, of the first reverse holding member and support the periphery of the substrate and a first driving mechanism that moves at least one of the first reverse holding member and the common reverse holding member so that the first reverse holding member and the common reverse holding member are selectively shifted between a state where the first reverse holding member and the common reverse holding member are spaced apart from each other in the direction of the first axis and a state where the first reverse holding member and the common reverse holding member are close to each other and the second holding mechanism may include a plurality of third supporters that are provided on the other surface of the common reverse holding member and support the periphery of the substrate, a second reverse holding member provided so as to face the other surface of the common reverse holding member, a plurality of fourth supporters that are provided on a surface, which faces the common reverse holding member, of the second reverse holding member and support the periphery of the substrate and a second driving mechanism that moves at least one of the second reverse holding member and the common reverse holding member so that the second reverse holding member and the common reverse holding member are selectively shifted between a state where the second reverse holding member and the common reverse holding member are spaced apart from each other in the direction of the first axis and a state where the second reverse holding member and the common reverse holding member are close to each other.

In this case, the substrate is inserted into a space between the plurality of first supporters provided on the one surface of the common reverse holding member and the plurality of second supporters provided on the surface, which faces the common reverse holding member, of the first reverse holding member in the state where the first reverse holding member and the common reverse holding member are spaced apart from each other. In the state, at least one of the first reverse holding member and the common reverse holding member is moved by the first driving mechanism so that the first reverse holding member and the common reverse holding member are close to each other. Thus, the periphery of the substrate is held by the plurality of first and second supporters.

In this state, the first reverse holding member, the second reverse holding member and the common reverse holding member are integrally rotated around the second axis by the rotating device. Accordingly, the substrate held by the first reverse holding member and the common reverse holding member is reversed.

Moreover, the substrate is inserted into a space between the plurality of third supporters provided on the other surface of the common reverse holding member and the plurality of fourth supporters provided on the surface, which faces the common reverse holding member, of the second reverse holding member in the state where the second reverse holding member and the common reverse holding member are spaced apart from each other. In the state, at least one of the second reverse holding member and the common reverse holding member is moved by the second driving mechanism so that the second reverse holding member and the common reverse holding member come close to each other. Thus, the periphery of the substrate is held by the plurality of third and fourth supporters.

In this state, the first reverse holding member, the second reverse holding member and the common reverse holding member are integrally rotated around the second axis by the rotating device. Accordingly, the substrate held by the second reverse holding member and the common reverse holding member is reversed.

(5) The common reverse holding member may be secured to the support member, the first driving mechanism may move the first reverse holding member relative to the common reverse holding member so that the first reverse holding member is selectively shifted between the state where the first reverse holding member and the common reverse holding member are spaced apart from each other and the state where the first reverse holding member and the common reverse holding member are close to each other, and the second driving mechanism may move the second reverse holding member relative to the common reverse holding member so that the second reverse holding member is selectively shifted between the state where the second reverse holding member and the common reverse holding member are spaced apart from each other and the state where the second reverse holding member and the common reverse holding member are close to each other.

In this case, the first reverse holding member is moved by the first driving mechanism so as to come close to the common reverse holding member, so that the substrate is held by the plurality of first and second supporters. Moreover, the second reverse holding member is moved by the second driving mechanism so as to come close to the common reverse holding member, so that the substrate is held by the plurality of third and fourth supporters. This allows the substrate to be reversed in the simple configuration.

(6) The second transport device may have first and second transport holders and a distance between a holding position of the substrate by the first holding mechanism and a holding position of the substrate by the second holding mechanism may be substantially equal to a distance between a holding position of the substrate by the first transport holder of the second transport device and a holding position of the substrate by the second transport holder.

In this case, the substrate after the reversing can be carried out of one of the first and second holding mechanisms by one of the first and second transport holders and the substrate before the reversing can be carried into the other of the first and second holding mechanisms by the other of the first and second transport holders by hardly moving the first and second transport holders of the second transport device in the direction parallel to the first axis. This allows the substrate to be carried into and out of the first and second reversing devices more quickly.

Furthermore, the two substrates can be simultaneously carried into the first and second holding mechanisms by the first and second transport holders while the two substrates can be simultaneously carried out of the first and second holding mechanisms by the first and second transport holders. Accordingly, the substrates can be quickly carried into and out of the first and second reversing devices while the plurality of substrates can be reversed efficiently.

(7) The processing unit may include a first cleaning processing unit that cleans the back surface of the substrate and the second transport device may transport the substrate among the first reversing device, the second reversing device and the first cleaning processing unit.

In this case, the substrate reversed by the first reversing device with the back surface thereof directed upward is transported to the first cleaning processing unit by the second transport device. The back surface of the substrate that is directed upward is cleaned in the first cleaning processing unit.

(8) The first cleaning processing unit may include a plurality of first cleaning units arranged in a plurality of stages.

As described above, the plurality of first cleaning units are arranged in the plurality of stages, so that the footprint can be reduced and the throughput of the back surface processing of the substrate can be improved. This can improve the throughput of the substrate processing of the whole substrate processing apparatus.

(9) The first reversing device may be used for reversing the substrate before the processing by the first cleaning processing unit.

In this case, the substrate before the processing by the first cleaning processing unit is reversed by the first reversing device. This prevents the substrate that is carried into the second reversing device after the processing from being contaminated by the substrate before the processing.

(10) The processing unit may further include a second cleaning processing unit that cleans the top surface of the substrate and the second transport device may transport the substrate among the first reversing device, the second reversing device, the first cleaning processing unit and the second cleaning processing unit.

In this case, the substrate with the top surface thereof directed upward is transported to the second cleaning processing unit by the second transport device. The top surface of the substrate that is directed upward is cleaned in the second cleaning processing unit.

(11) The second cleaning processing unit may include a plurality of second cleaning units arranged in a plurality of stages.

As described above, the plurality of second cleaning units are arranged in the plurality of stages, so that the footprint can be reduced while the throughput of the top surface processing of the substrate can be improved. This can improve the throughput of the substrate processing of the whole substrate processing apparatus.

(12) The first reversing device may be used for reversing the substrate after the processing by the first cleaning processing unit.

In this case, the substrate after the processing by the first cleaning processing unit is reversed by the first reversing device. Thus, the substrate after the processing by the second cleaning processing unit can be transferred to the first transport device through the second reversing device. Accordingly, the substrate that is carried into the second reversing device after the processing is prevented from being contaminated by the substrate before the processing.

(13) According to another aspect of the present invention, a substrate processing method that subjects a substrate to processing by a substrate processing apparatus including a carrying in and out region that includes a container platform and a first transport device, a processing region that includes a plurality of processing units and a second transport device, and first and second reversing devices provided between the processing region and the carrying in and out region includes the steps of taking the substrate before the processing out of a storing container placed on the container platform and transferring the taken out substrate before the processing to the first reversing device by the first transport device, reversing the substrate before the processing in the first reversing device, receiving the substrate before the processing from the first reversing device and carrying the received substrate into any of the plurality of processing units by the second transport device, carrying the substrate having been processed in any of the plurality of processing units out of the processing unit and transferring the carried out substrate after the processing to the second reversing device by the second transport device, and receiving the substrate after the processing from the second reversing device and storing the received substrate after the processing in the storing container by the first transport device.

A series of the processes in the substrate processing method is shown below. First, the substrate before the processing is taken out of the storing container placed on the container platform by the first transport device. The taken out substrate before the processing is transferred to the first reversing device by the first transport device.

Next, the substrate before the processing is received from the first reversing device to the second transport device, and the received substrate before the processing is carried into any of the plurality of processing units by the second transport device.

Then, the substrate having been processed in any of the plurality of processing units is carried out of the processing unit by the second transport device and the carried out substrate after the processing is transferred to the second reversing device by the second transport device. The substrate after the processing is subsequently received from the second reversing device by the first transport device, and the received substrate after the processing is stored in the storing container by the first transport device.

As described above, the first and second reversing devices are provided between the processing region and the carrying in and out region, so that the transporting process between the first transport device and the first and second reversing devices by the second transport device can be eliminated. Accordingly, the number of the transporting processes by the second transport device for the single substrate is reduced. This improves throughput of the substrate processing.

Moreover, since the first reversing device is used in transfer of the substrate from the first transport device to the second transport device, that is, in transfer of the substrate before the processing, and the second reversing device is used in transfer of the substrate from the second transport device to the first transport device, that is, in transfer of the substrate after the processing, the substrate after the processing is prevented from being contaminated by the substrate before the processing when the substrate is received and transferred between the first transport device and the second transport device.

In addition, the first and second reversing devices are provided between the processing region and the carrying in and out region, so that the configuration of the existing substrate processing apparatus (the configurations of the so-called platforms) is not required to be changed. Thus, the increase in the production cost of the substrate processing apparatus can be suppressed. Moreover, providing the first and second reversing devices does not increase the footprint of the substrate processing apparatus or prevent the substrate processing apparatus from being reduced in size.

Furthermore, the first and second reversing devices function as the interfaces, so that the production cost of the substrate processing apparatus can be further reduced.

According to the configuration of the present invention, the throughput of the substrate processing can be improved. In addition, the substrate after the processing can be prevented from being contaminated by the substrate before the processing when the substrate is received and transferred between the first transport device and the second transport device. Moreover, the increase in the production cost of the substrate processing apparatus can be suppressed. Furthermore, the footprint of the substrate processing apparatus is not increased and the substrate processing apparatus is not prevented from being reduced in size.

Other features, elements, characteristics, and advantages of the present invention will become more apparent from the following description of preferred embodiments of the present invention with reference to the attached drawings.

DESCRIPTION OF THE PREFERRED EMBODIMENTS

A substrate processing apparatus according to an embodiment of the present invention will now be described with reference to drawings.

In the following description, a substrate refers to a semiconductor wafer, a glass substrate for a liquid crystal display, a glass substrate for a PDP (plasma display panel), a glass substrate for a photomask and a substrate for an optical disk or the like.

In the following description, a surface of the substrate on which a variety of patterns such as a circuit pattern or the like are to be formed is referred to as a top surface and the opposite surface thereof is referred to as a back surface. In addition, a surface of the substrate directed downward is referred to as a lower surface and a surface of the substrate directed upward is referred to as an upper surface.

(1) First Embodiment

(1-1) Configuration of Substrate Processing Apparatus

Figure 1:
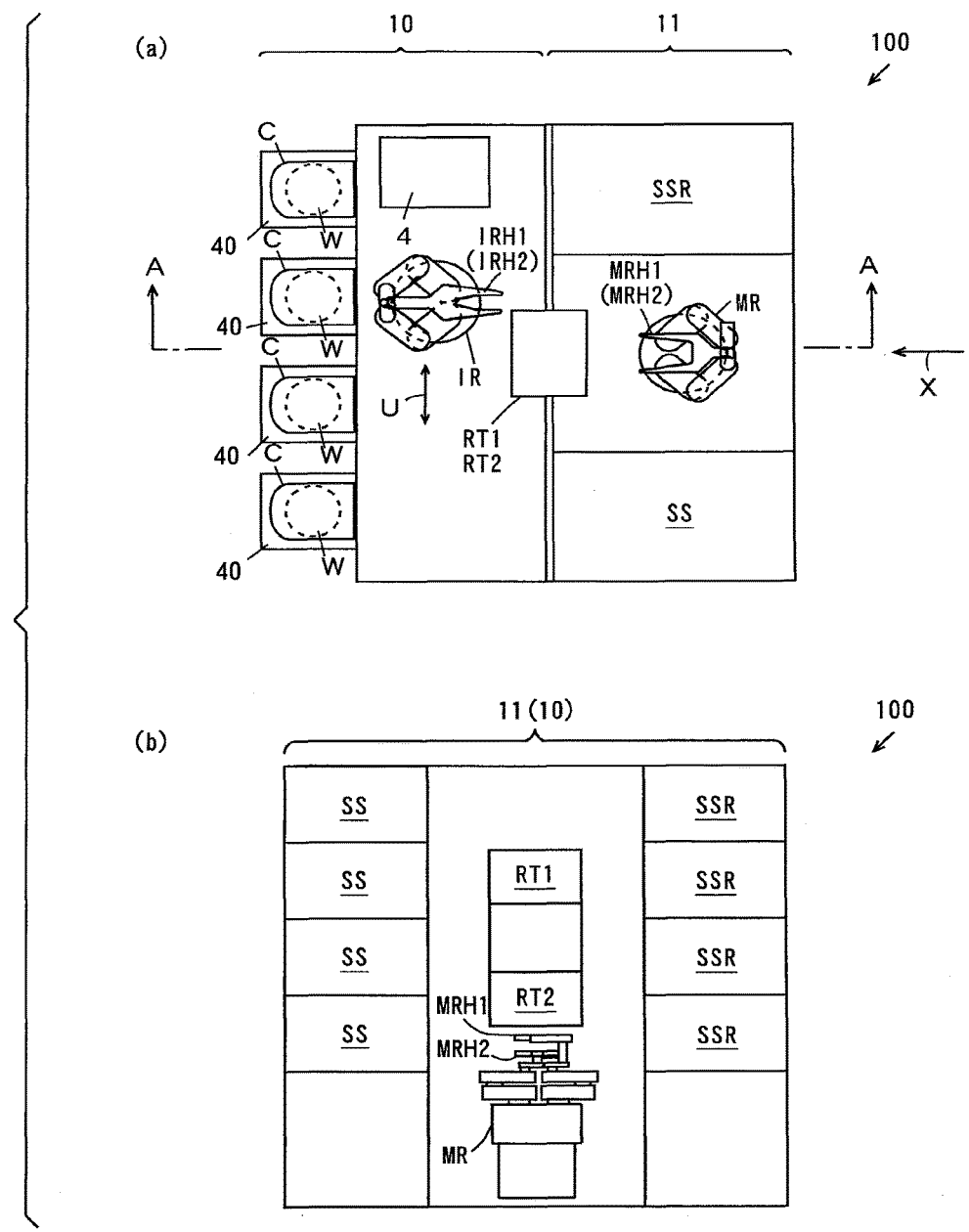
FIG. 1 is a schematic view showing a configuration of a substrate processing apparatus according to a first embodiment.
Figure 2:
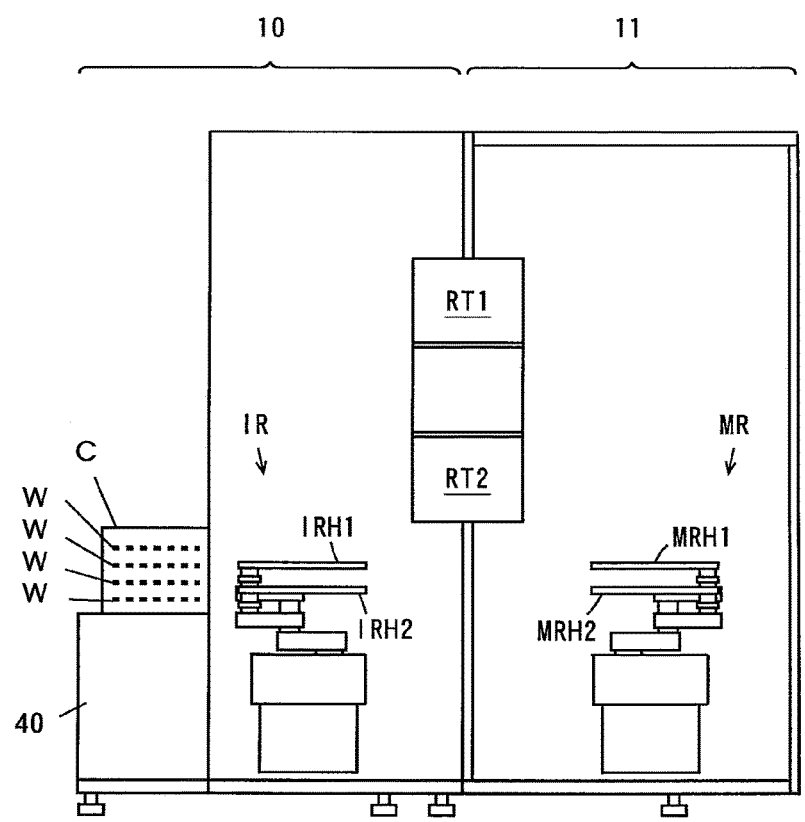
FIG. 2 is a schematic view showing a cross section of FIG. 1 (a) taken along the line A-A.

FIG. 1 is a schematic view showing a configuration of a substrate processing apparatus according to a first embodiment. FIG. 1(a) is a plan view of the substrate processing apparatus and FIG. 1(b) is a side view in which the substrate processing apparatus of FIG. 1(a) is seen from the direction of the arrow X. FIG. 2 is a schematic view showing a cross section of FIG. 1 (a) taken along the line A-A.

As shown in FIG. 1 (a), the substrate processing apparatus 100 includes an indexer block 10 and a processing block 11. The indexer block 10 and the processing block 11 are provided in parallel to each other.

The indexer block 10 is provided with a plurality of carrier platforms 40, an indexer robot IR and a controller 4. Carriers C that store a plurality of substrates W in multiple stages are placed on the carrier platforms 40, respectively.

The indexer robot IR is constructed so that it can move in the direction of the arrow U (FIG. 1 (a)), rotate around a vertical axis and move up and down. The indexer robot IR has hands IRH1, IRH2 provided one above the other for receiving and transferring the substrate W. The hands IRH1, IRH2 hold a peripheral portion of the lower surface of the substrate W and an outer circumference of the substrate W. The controller 4 is composed of a computer or the like including a CPU (central processing unit), and controls each unit in the substrate processing apparatus 100.

As shown in FIG. 1 (b), a plurality of (four in FIG. 1 (b)) top surface cleaning units SS, a plurality of (four in FIG. 1(b)) back surface cleaning units SSR and a main robot MR are provided in the processing block 11.

One side of the processing block 11 has a vertical stack of the plurality of top surface cleaning units SS, and the other side of the processing block 11 has a vertical stack of the plurality of back surface cleaning units SSR. The main robot MR is provided between the plurality of top surface cleaning units SS and the plurality of back surface cleaning units SSR. The main robot MR is constructed so that it can rotate around a vertical axis and move up and down.

Moreover, the main robot MR has hands MRH1, MRH2 provided one above the other for receiving and transferring the substrate W. The hands MRH1, MRH2 hold the peripheral portion of the lower surface of the substrate W and the outer circumference of the substrate W. Details of the main robot MR will be described later.

As shown in FIG. 2, reversing units RT1, RT2 for reversing the substrate W are provided one above the other at a predetermined spacing between the indexer block 10 and the processing block 11. Details of the reversing units RT1, RT2 will be described later.

(1-2) Summary of Operations of the Substrate Processing Apparatus

Next, a summary of operations of the substrate processing apparatus 100 will be described with reference to FIG. 1 and FIG. 2. Note that an operation of each component of the substrate processing apparatus 100, described below, is controlled by the controller 4 of FIG. 1 (a).

First, the indexer robot IR takes out the unprocessed substrate W from one of the carriers C placed on the carrier platforms 40 by using the lower hand IRH2. At this point, the top surface of the substrate W is directed upward.

The hand IRH2 of the indexer robot IR holds the peripheral portion of the back surface of the substrate W and the outer circumference of the substrate W. The indexer robot IR turns around the vertical axis while moving in the direction of the arrow U, and transfers the unprocessed substrate W to a reversing unit RT1.

In the reversing unit RT1, the unprocessed substrate W with the top surface thereof directed upward is reversed so that the back surface thereof is directed upward. The substrate W after reversing is carried out of the reversing unit RT1 by the main robot MR, and subsequently carried into the back surface cleaning unit SSR.

In the back surface cleaning unit SSR, cleaning processing is performed on the back surface of the substrate W. Hereinafter, the cleaning processing of the back surface of the substrate W is referred to as the back surface cleaning processing. Note that details of the back surface cleaning processing by the back surface cleaning unit SSR will be described later.

The substrate W after the back surface cleaning processing is carried out of the back surface cleaning unit SSR by the main robot MR, and subsequently carried into the reversing unit RT1. In the reversing unit RT1, the substrate W with the back surface thereof directed upward is reversed so that the top surface thereof is directed upward. The substrate W after the reversing is carried out of the reversing unit RT1 by the main robot MR, and subsequently carried into the top surface cleaning unit SS.

In the top surface cleaning unit SS, cleaning processing is performed on the top surface of the substrate W. Hereinafter, the cleaning processing of the top surface of the substrate W is referred to as the top surface cleaning processing. Note that details of the top surface cleaning processing by the top surface cleaning unit SS will be described later.

The substrate W after the top surface cleaning processing is carried out of the top surface cleaning unit SS by the main robot MR, and carried into the reversing unit RT2. The carried in substrate W is held in the reversing unit RT2 without being reversed, and subsequently received by the indexer robot IR and stored in the carrier C.

(1-3) Details of the Main Robot

Figure 3:
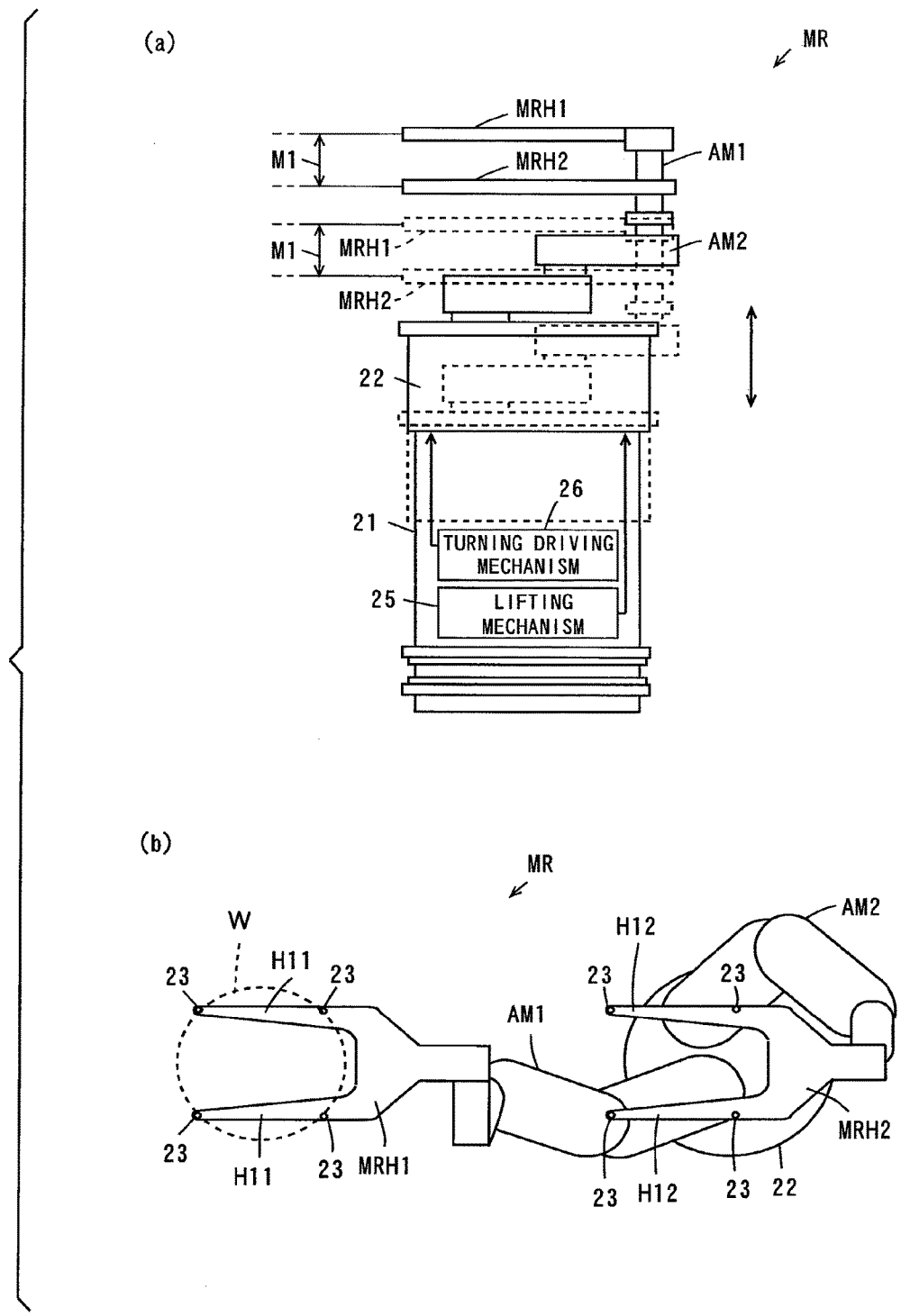
FIG. 3 is a schematic view showing a detailed configuration of a main robot.

Next, details of the configuration of the main robot MR will be described. FIG. 3 (a) is a side view of the main robot MR, and FIG. 3 (b) is a plan view of the main robot MR.

As shown in FIG. 3 (a) and FIG. 3 (b), the main robot MR includes a base 21, to which a moving portion 22 is attached, so as to be able to vertically move and turn with respect to the base 21. The hands MRH1 and MRH2 are connected to the moving portion 22 by multi-joint type arms AM1 and AM2, respectively.

The moving portion 22 is moved up and down by a lifting mechanism 25 provided in the base 21 while being turned around a vertical axis by a turning driving mechanism 26 provided in the base 21.

The multi-joint type arms AM1, AM2 are independently driven by driving mechanisms that are not shown, respectively, and horizontally move the respective hands MRH1, MRH2 forward and backward while keeping them in fixed postures.

Each of the hands MRH1, MRH2 is arranged to have a certain height with respective to the moving portion 22, and the hand MRH1 is positioned above the hand MRH2. A difference M1 (FIG. 3 (a)) in height between the hands MRH1 and MRH2 is maintained constant.

The hands MRH1, MRH2 have the same shape and are formed to be approximately U-shaped, respectively. The hand MRH1 has two claw portions H11 extending substantially in parallel to each other and the hand MRH2 has two claw portions H12 extending substantially in parallel to each other.

Furthermore, a plurality of support pins 23 are attached on the hands MRH1, MRH2, respectively. In the present embodiment, the four support pins 23 are attached on the upper surfaces of the hands MRH1, MRH2, respectively, at substantially equal distances from each other along the outer circumference of the substrate W placed thereon. The peripheral portion of the lower surface of the substrate W and the outer circumference of the substrate W are held by the four support pins 23.

(1-4) Details of the Reversing Units

Figure 4:
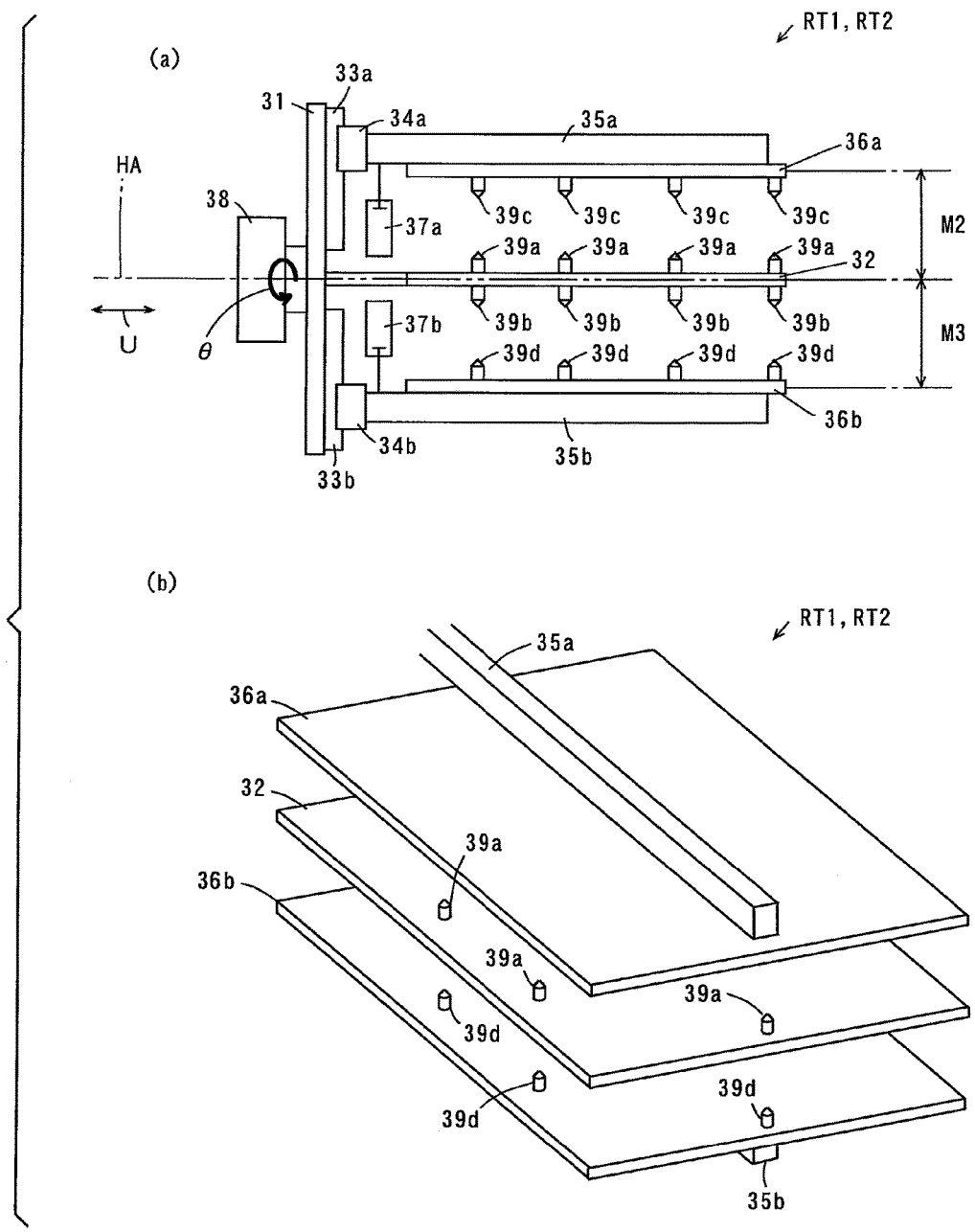
FIG. 4 is a schematic view showing a configuration of a reversing unit.

Next, details of the reversing units RT1, RT2 are described. The reversing units RT1, RT2 have the same configuration. FIG. 4 (a) is a side view of the reversing unit RT1, RT2, and FIG. 4 (b) is a perspective view of the reversing unit RT1, RT2.

As shown in FIG. 4 (a), the reversing unit RT1, RT2 includes a support plate 31, a fixed plate 32, a pair of linear guides 33a, 33b, a pair of support members 35a, 35b, a pair of cylinders 37a, 37b, a first movable plate 36a, a second movable plate 36b and a rotary actuator 38.

The support plate 31 is provided so as to vertically extend and the fixed plate 32 is attached to the support plate 31 so as to extend horizontally from the center of one surface of the support plate 31. The linear guide 33a extending in a vertical direction to the fixed plate 32 is provided in a region of the support plate 31 on one surface side of the fixed plate 32. In addition, the linear guide 33b extending in the vertical direction to the fixed plate 32 is provided in the region of the support plate 31 on the other surface side of the fixed plate 32. The linear guides 33a, 33b are provided symmetrically with respect to the fixed plate 32.

The support member 35a is provided so as to extend in a parallel direction to the fixed plate 32 on the one surface side of the fixed plate 32. The support member 35a is slidably attached to the linear guide 33a by a coupling member 34a. The support member 35a is connected to the cylinder 37a, which moves the support member 35a up and down along the linear guide 33a. In this case, the support member 35a moves in the vertical direction to the fixed plate 32 while being maintained in a fixed posture. Moreover, the first movable plate 36a is attached to the support member 35a so as to face the one surface of the fixed plate 32.

On the other surface side of the fixed plate 32, the support member 35b is provided so as to extend in the parallel direction to the fixed plate 32. The support member 35b is slidably attached to the linear guide 33b by a coupling member 34b. The support member 35b is connected to the cylinder 37b, which moves the support member 35b up and down along the linear guide 33b. In this case, the support member 35b moves in the vertical direction to the fixed plate 32 while being maintained in a fixed posture. Furthermore, the second movable plate 36b is attached to the support member 35b so as to face the other surface of the fixed plate 32.

With the first movable plate 36a and the second movable plate 36b being farthest away from the fixed plate 32, a distance M2 between the first movable plate 36a and the fixed plate 32 and a distance M3 between the second movable plate 36b and the fixed plate 32 are set to be substantially equal to the difference M1 in height between the hand MRH1 and the hand MRH2 of the main robot MR shown in FIG. 3 in the present embodiment.

The rotary actuator 38 rotates the support plate 31 around the horizontal axis HA parallel to the direction of the arrow U (FIG. 1). Accordingly, the first movable plate 36a, the second movable plate 36b and the fixed plate 32 that are coupled to the support plate 31 rotate around the horizontal axis HA (in the direction of θ).

As shown in FIG. 4(b), each of the first movable plate 36a, the fixed plate 32 and the second movable plate 36b is formed in the shape of a flat plate.

In addition, a plurality of support pins 39a are provided on the one surface, which faces the first movable plate 36a, of the fixed plate 32, and a plurality of support pins 39b are provided on the other surface of the fixed plate 32 as shown in FIG. 4 (a). Moreover, a plurality of support pins 39c are provided on one surface, which faces the fixed plate 32, of the first movable plate 36a, and a plurality of support pins 39*d* are provided on one surface, which faces the fixed plate 32, of the second movable plate 36*b*.

In the present embodiment, respective six pieces of the support pins 39*a*, 39*b*, 39*c*, 39*d* are provided. These support pins 39*a*, 39*b*, 39*c*, 39*d* are arranged along the outer circumference of the substrate W that is carried into the reversing unit RT1, RT2. Moreover, the support pins 39*a*, 39*b*, 39*c*, 39*d* have the same length. Therefore, with the first movable plate 36*a* and the second movable plate 36*b* being farthest away from the fixed plate 32, a distance between the tips of the support pins 39*a* and the tips of the support pins 39*d* and a distance between the tips of the support pins 39*b* and the tips of the support pins 39*c* are substantially equal to the difference M1 in height between the hand MRH1 and the hand MRH2 of the main robot MR shown in FIG. 3.

Note that the distance M2 between the first movable plate 36*a* and the fixed plate 32 and the distance M3 between the second movable plate 36*b* and the fixed plate 32 may be suitably changed. With the first movable plate 36*a* and the second movable plate 36*b* being farthest away from the fixed plate 32, the distance between the tips of the support pins 39*c* and the tips of the support pins 39*d* is set to be larger than the difference M1 in height between the hand MRH1 and the hand MRH2.

(1-5) Carrying in and Out Operations by the Main Robot

Carrying in and out operations by the main robot MR will be subsequently described with reference to FIG. 1 and FIG. 2.

First, the main robot MR receives the unprocessed substrate W with the back surface thereof directed upward from the reversing unit RT1 by the hand MRH2.

Next, the main robot MR carries the substrate W after the back surface cleaning processing out of any of the back surface cleaning units SSR by the hand MRH1 and carries the above-mentioned unprocessed substrate W held by the hand MRH2 into the back surface cleaning unit SSR.

Then, the main robot MR carries the substrate W with the top surface thereof directed upward out of the reversing unit RT1 by the hand MRH2, and carries the substrate W after the above-mentioned back surface cleaning processing held by the hand MRH1 into the reversing unit RT1.

The main robot MR subsequently carries the substrate W after the top surface cleaning processing out of any of the top surface cleaning units SS by the hand MRH1, and carries the above-mentioned substrate W with the top surface thereof directed upward held by the hand MRH2 into the top surface cleaning unit SS.

Next, the main robot MR carries the unprocessed substrate W with the back surface thereof directed upward out of the reversing unit RT1 by the hand MRH2, and carries the above-mentioned substrate W after the top surface cleaning processing held by the hand MRH1 into the reversing unit RT2. The main robot MR successively performs a series of such operations.

(1-6) First Pattern of Carrying the Substrate into and Out of the Reversing Unit by the Main Robot Here, explanations on how the substrate W is carried into and out of the reversing unit RT1, RT2 by the indexer robot IR and how the substrate W is carried into and out of the reversing unit RT1, RT2 by the main robot MR will be briefly made before making an explanation on carrying of the substrate W into and out of the reversing unit RT1, RT2 by the main robot MR.

Figure 5:
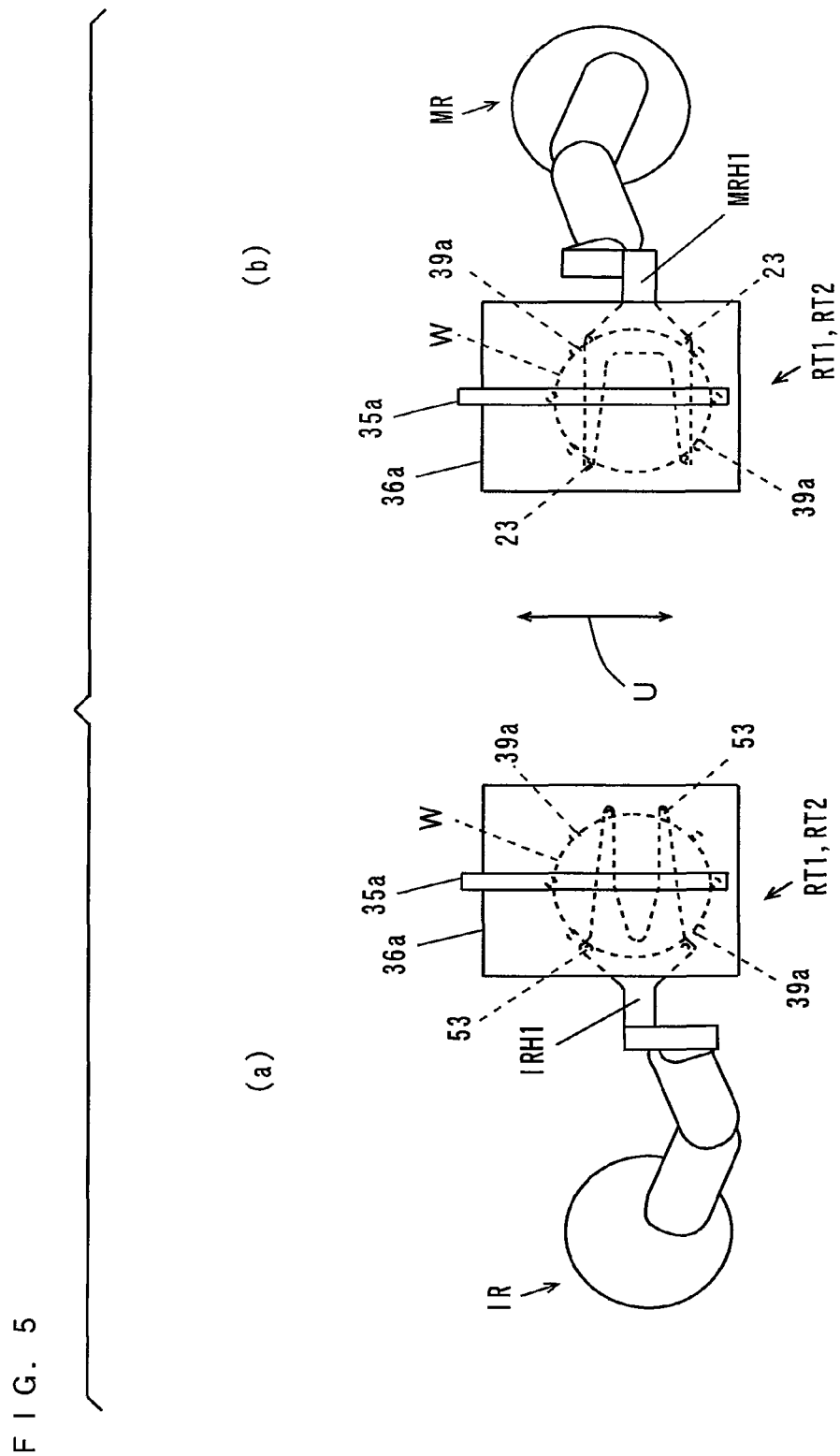
FIG. 5 is an explanatory view showing how a substrate is carried into and out of the reversing unit by each of an indexer robot and the main robot.

FIG. 5 (*a*) is an explanatory view showing how the substrate W is carried into and out of the reversing unit RT1, RT2 by the indexer robot IR, and FIG. 5 (*b*) is an explanatory view showing how the substrate W is carried into and out of the reversing unit RT1, RT2 by the main robot MR.

As shown in FIG. 5 (*a*), (*b*), the reversing unit RT1, RT2 is arranged so that the length direction of the support member 35*a* is in parallel to the direction of the arrow U. That is, the above-mentioned direction of the arrow U is perpendicular to the direction of forward and backward movements of the hands IRH1, IRH2 (shown in FIG. 1, not shown in FIG. 5) of the indexer robot IR at the time of carrying in and out the substrate W and the direction of forward and backward movements of the hand MRH1, MRH2 (shown in FIG. 1, not shown in FIG. 5) of the main robot MR at the time of carrying in and out the substrate W.

In FIG. 5 (*a*), a plurality of support pins 53 are attached on the hands IRH1, IRH2, respectively. In the present embodiment, the four support pins 53 are attached on the upper surface of the hands IRH1, IRH2, respectively, at substantially equal distances from each other along the outer circumference of the substrate W placed thereon. The peripheral portion of the lower surface of the substrate W and the outer circumference of the substrate W are held by the four support pins 53.

In the present embodiment, while the hands IRH1, IRH2 of the indexer robot IR are different from the hands MRH1, MRH2 of the main robot MR in shape, the respective support pins 39*a*, 39*b*, 39*c*, 39*d* of the reversing units RT1, RT2 (only the support pins 39*a* are shown in FIG. 5) are provided in positions with which either of the hands IRH1, IRH2 or the hands MRH1, MRH2 does not come into contact when the substrate W is carried in and out as shown in FIG. 5 (*a*), (*b*).

Next, the first pattern of carrying the substrate into and out of the reversing unit RT1 by the main robot MR is described.

Figure 6:
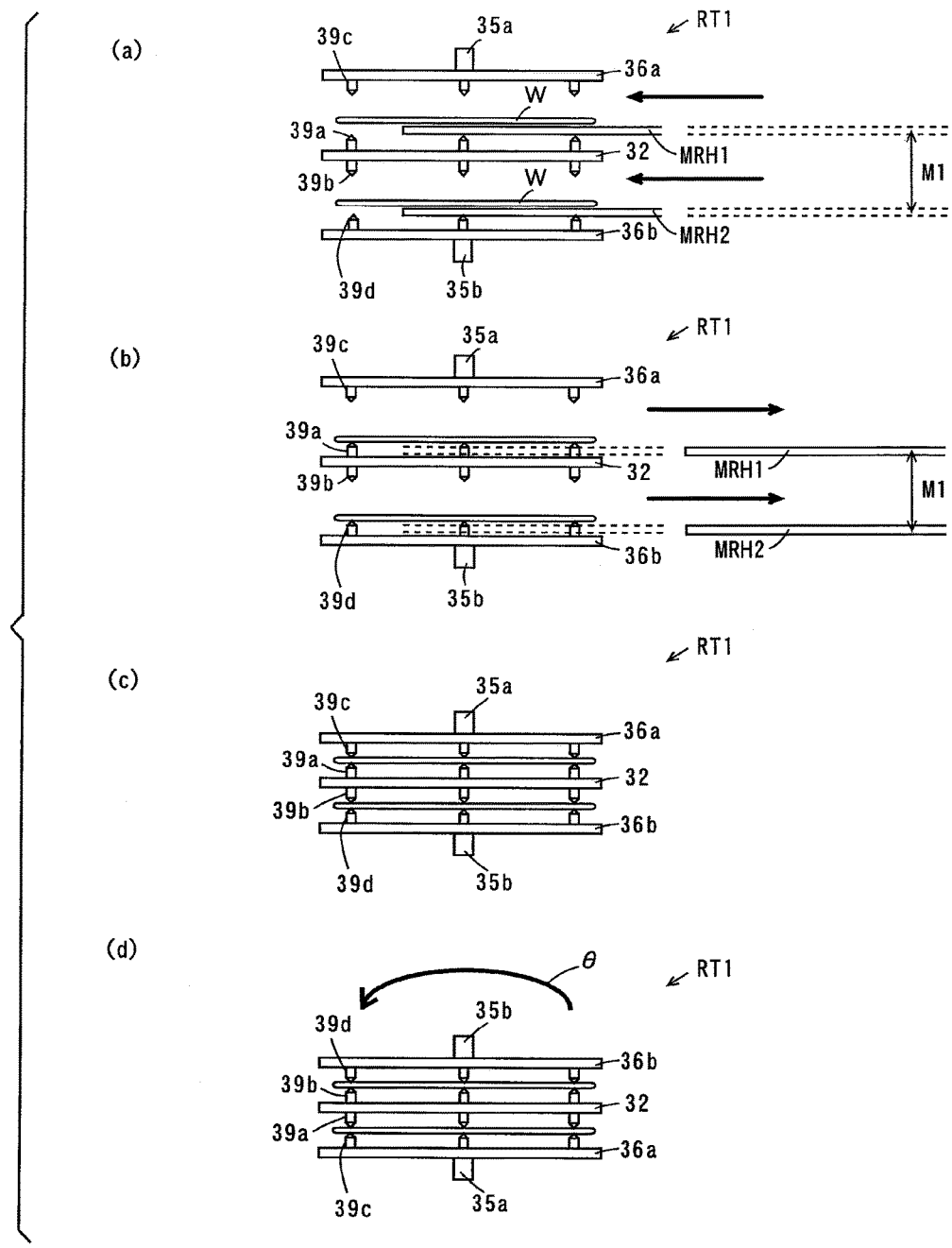
FIG. 6 is an explanatory view showing a first pattern of carrying the substrate into and out of the reversing unit by the main robot.
Figure 7:
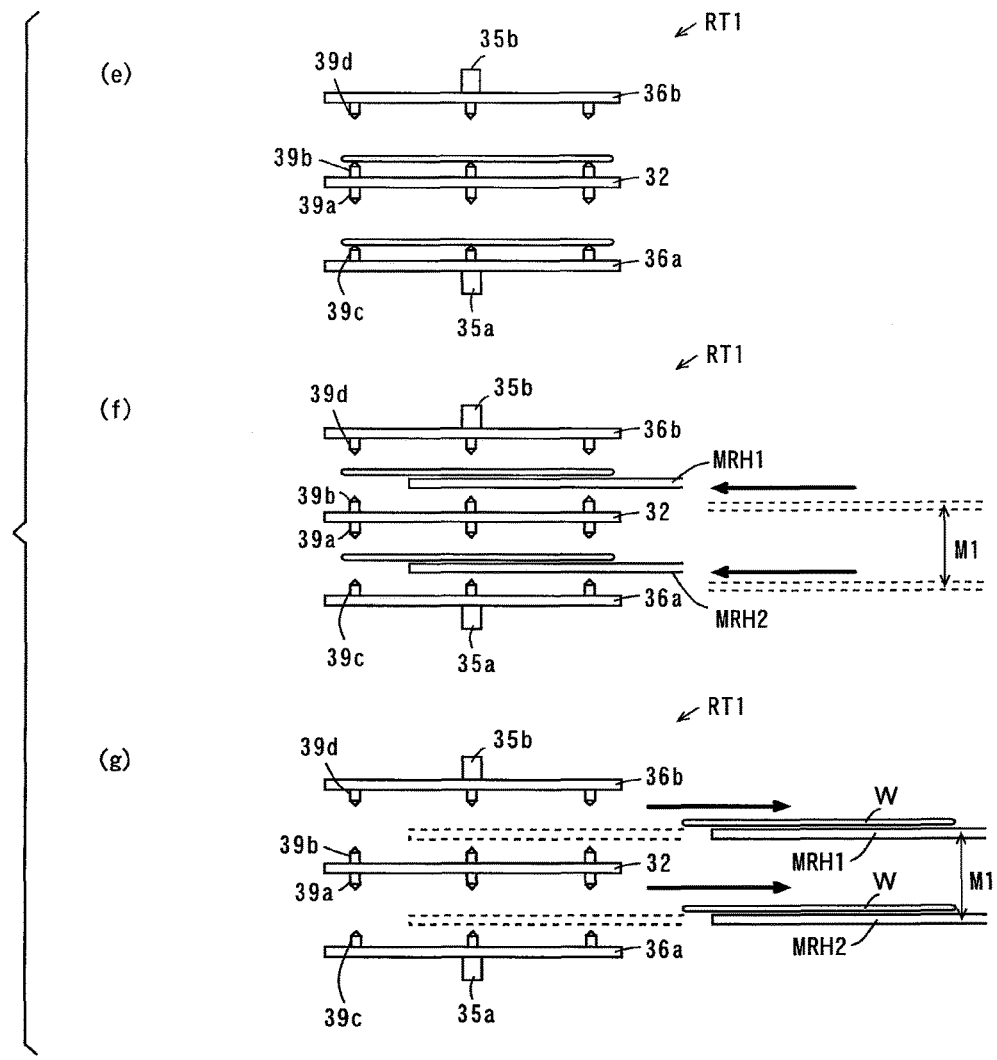
FIG. 7 is an explanatory view showing the first pattern of carrying the substrate into and out of the reversing unit by the main robot.

FIG. 6 and FIG. 7 are explanatory views showing the first pattern of carrying the substrate into and out of the reversing unit RT1 by the main robot MR. Note that since the operation of the respective processes of the reversing units RT1, RT2 are the same, the case where the substrates W after the back surface cleaning processing by the back surface cleaning unit SSR are carried into the reversing unit RT1 by the hands MRH1, MRH2 and the substrates W after the back surface cleaning processing are reversed by the reversing unit RT1 is explained as an example in FIG. 6 and FIG. 7.

As shown in FIG. 6 (*a*), the hands MRH1, MRH2 holding the substrates W simultaneously advance between the first movable plate 36*a* and the fixed plate 32 and between the second movable plate 36*b* and the fixed plate 32.

Then, the hands MRH1, MRH2 are simultaneously lowered and withdraw as shown in FIG. 6 (*b*). Thus, the substrates W are placed on the support pins 39*a*, 39*d*. In this case, the substrates W with their back surfaces directed upward are placed on the support pins 39*a*, 39*d* in the reversing unit RT1.

Next, the support member 35*a* is lowered by the cylinder 37*a* (FIG. 4 (*a*)) while the support member 35*b* is lifted by the cylinder 37*b* (FIG. 4 (*a*)) as shown in FIG. 6 (*c*). Thus, the one substrate W is held by the support pins 39*c* of the first movable plate 36*a* and the support pins 39*a* of the fixed plate 32, and the other substrate W is held by the support pins 39*d* of the second movable plate 36*b* and the support pins 39*b* of the fixed plate 32.

In the state, the first movable plate 36a, the fixed plate 32 and the second movable plate 36b are integrally rotated by the rotary actuator 38 by 180 degrees in the direction of θ (around the horizontal axis HA) as shown in FIG. 6 (d). Accordingly, the substrate W held by the support pins 39a, 39c and the substrate W held by the support pins 39b, 39d are reversed. In this case, the top surfaces of the substrates W are directed upward in the reversing unit RT1.

Next, the support member 35a is lowered by the cylinder 37a while the support member 35b is lifted by the cylinder 37b as shown in FIG. 7 (e). Accordingly, the first movable plate 36a is lowered while the second movable plate 36b is lifted. Therefore, the one substrate W is supported by the support pins 39c of the first movable plate 36a, and the other substrate W is supported by the support pins 39b of the fixed plate 32.

In the state, the hands MRH1, MRH2 advance below the substrate W supported by the support pins 39b and below the substrate W supported by the support pins 39c, respectively, and are lifted as shown in FIG. 7 (f). Thus, the substrate W supported by the support pins 39b is received by the hand MRH1 and the substrate W supported by the support pins 39c is received by the hand MRH2. Thereafter, the hands MRH1, MRH2 simultaneously withdraw, so that the two substrates W are carried out of the reversing unit RT1 as shown in FIG. 7 (g).

Note that the hands IRH1, IRH2 of the indexer robot IR may simultaneously carry the substrates W taken out of the carriers C into the reversing unit RT1 and may simultaneously carry the substrates W out of the reversing unit RT2 and store them in the carriers C, similarly to the case of the hands MRH1, MRH2 of the main robot MR described above.

(1-7) Second Pattern of Carrying the Substrate into and Out of the Reversing Unit by the Main Robot While the example of simultaneously carrying in and out the two substrates W by the hands MRH1, MRH2 of the main robot MR is explained in (1-6) above, an example of carrying the substrate W before the reversing into the reversing unit RT1 by one hand (the hand MRH1 in the following), and subsequently carrying the substrate W after the reversing out of the reversing unit RT1 by the other hand (the hand MRH2 in the following) is described here. Note that the reversing operation of the substrate W by the reversing unit RT1 is not described or shown since the similar description has been made above.

Figure 8:
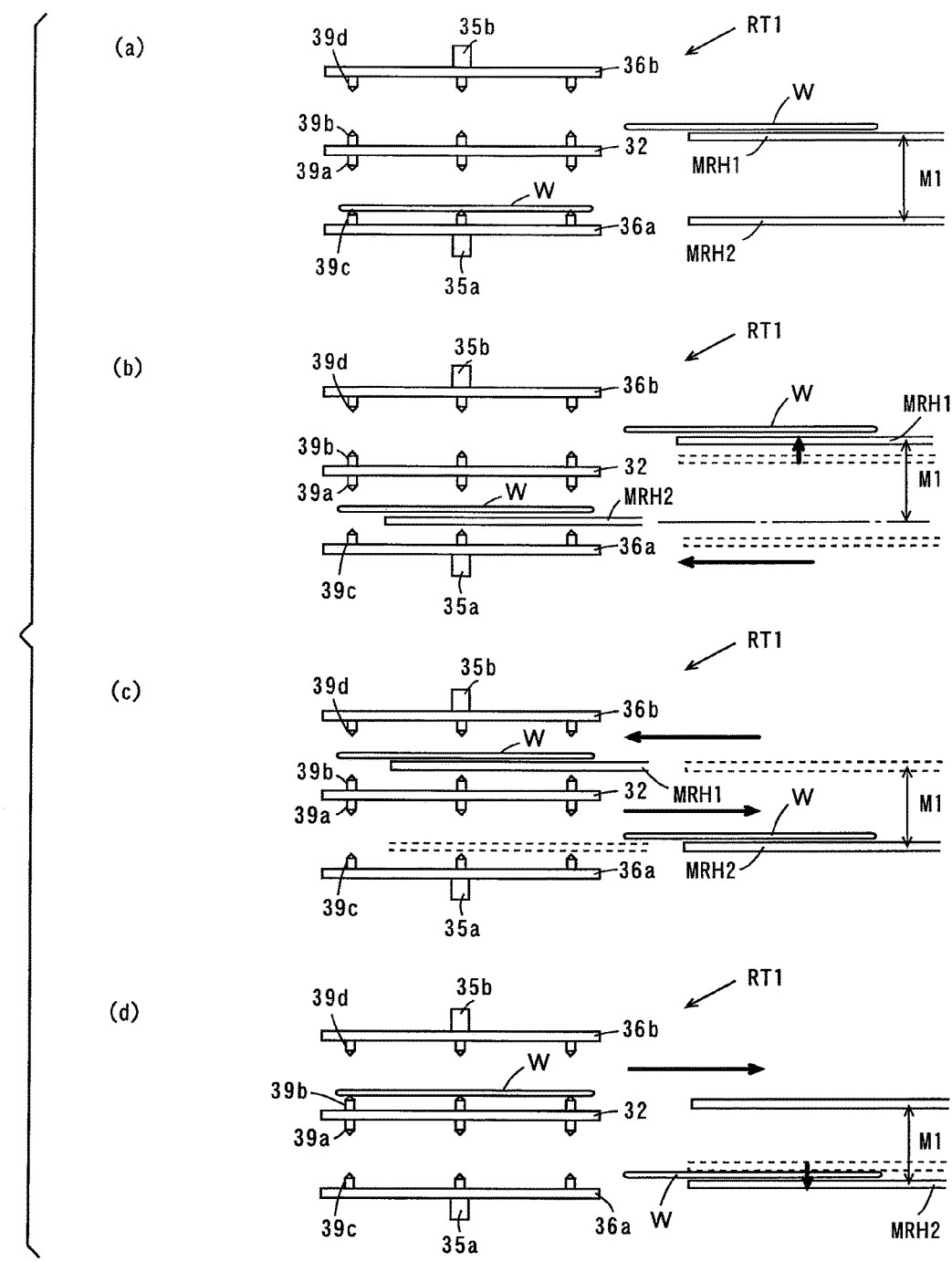
FIG. 8 is an explanatory view showing a second pattern of carrying the substrate into and out of the reversing unit by the main robot.

FIG. 8 is an explanatory view showing the second pattern of carrying the substrate into and out of the reversing unit RT1 by the main robot MR.

The main robot MR carries the substrate W after the reversing out of the reversing unit RT1 by the hand MRH2, and subsequently carries the substrate W before the reversing into the reversing unit RT1 by the hand MRH1. Thus, the hand MRH1 of the main robot MR holds the substrate W before the reversing and the hand MRH2 does not hold the substrate W immediately before the substrate W is carried out of the reversing unit RT1 as shown in FIG. 8 (a).

Then, the hand MRH2 advances and is lifted, so that the substrate W on the support pins 39c is received by the hand MRH2 as shown in FIG. 8 (b). Here, since the difference M1 in height between the hand MRH1 and the hand MRH2 is maintained constant, the hand MRH1 is lifted in accordance with the upward movement of the hand MRH2.

Next, the hand MRH2 withdraws while the hand MRH1 advances with the heights of the hands MRH1, MRH2 maintained as shown in FIG. 8 (c).

Here, the distance M2 between the first movable plate 36a and the fixed plate 32 (FIG. 4) and the distance M3 between the second movable plate 36b and the fixed plate 32 (FIG. 4) are set to be substantially equal to the difference M1 in height between the hand MRH1 and the hand MRH2.

Therefore, when the hand MRH2 is positioned at a level in between the first movable plate 36a and the fixed plate 32, the hand MRH1 is positioned at a level in between the second movable plate 36b and the fixed plate 32. Accordingly, the hand MRH1 advances to move to a position in between the second movable plate 36b and the fixed plate 32.

The hand MRH1 is subsequently lowered and withdraws as shown in FIG. 8 (d). Accordingly, the substrate W is placed on the support pins 39b. Here, the hand MRH2 is lowered in accordance with the downward movement of the hand MRH1.

In this way, the substrate W is carried into and out of the reversing unit RT1 by the main robot MR. Thereafter, the reversing unit RT1 reverses the substrate W subsequently carried therein. That is, the substrate W is carried into the reversing unit RT1 alternately in the state where the first movable plate 36a is positioned above the fixed plate 32 and the state where the second movable plate 36b is positioned above the fixed plate 32.

(1-8) Details of the Top Surface Cleaning Unit and the Back Surface Cleaning Unit Next, a configuration of each of the top surface cleaning unit SS and the back surface cleaning unit SSR of FIG. 1 is described.

Figure 9:
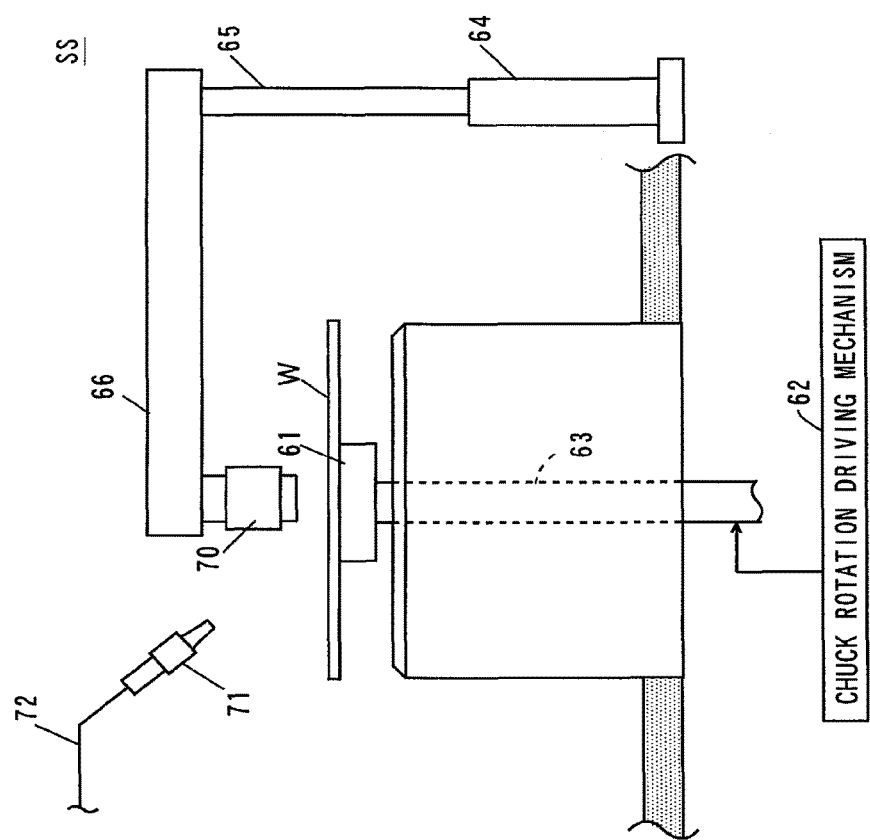
FIG. 9 is a schematic view showing a configuration of a top surface cleaning unit.
Figure 10:
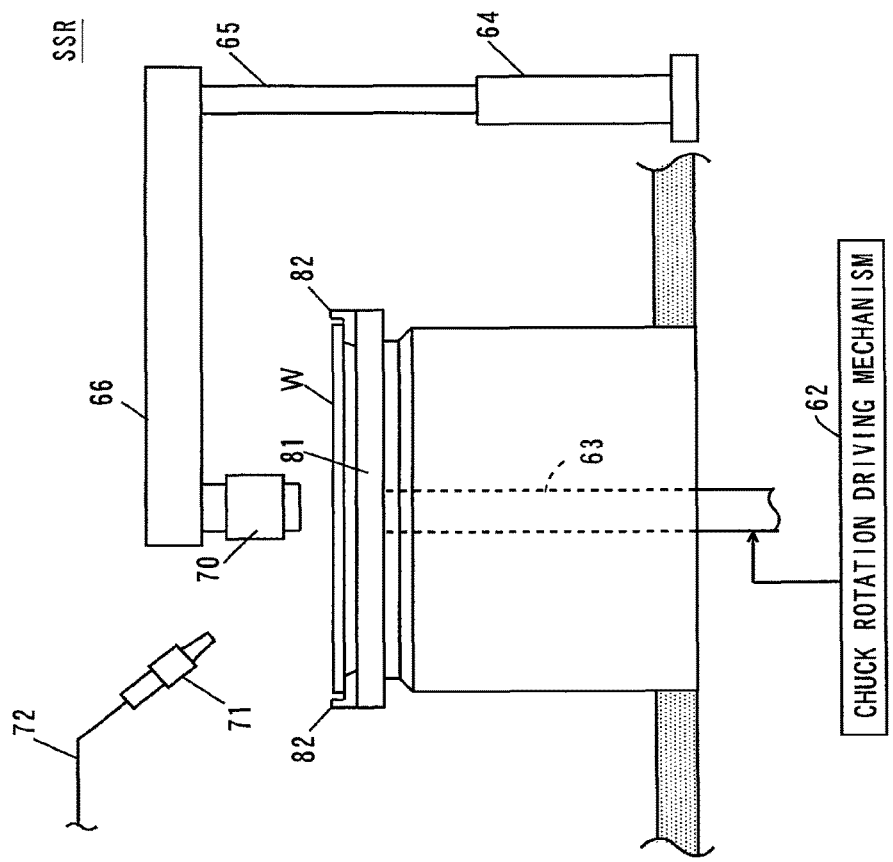
FIG. 10 is a schematic view showing a configuration of a back surface cleaning unit.

FIG. 9 is a schematic view showing the configuration of the top surface cleaning unit SS, and FIG. 10 is a schematic view showing the configuration of the back surface cleaning unit SSR.

In each of the top surface cleaning unit SS of FIG. 9 and the back surface cleaning unit SSR of FIG. 10, the cleaning processing of the substrate W by using a brush (hereinafter referred to as the scrub cleaning processing) is performed.

As shown in FIG. 9, the top surface cleaning unit SS includes a spin chuck 61 for rotating the substrate W around a vertical axis passing through the center of the substrate W while holding the substrate W horizontally. The spin chuck 61 is secured to the upper end of a rotation shaft 63 that is rotated by a chuck rotation driving mechanism 62.

As described above, the substrate W with the top surface thereof directed upward is carried into the top surface cleaning unit SS. When the scrub cleaning processing and rinsing processing are performed, the back surface of the substrate W is held by suction on the spin chuck 61.

A motor 64 is provided outside the spin chuck 61. A rotation shaft 65 is connected to the motor 64. An arm 66 is coupled to the rotation shaft 65 so as to extend in a horizontal direction, and a substantially cylindrical brush cleaner 70 is provided on the tip of the arm 66.

In addition, above the spin chuck 61, a liquid discharge nozzle 71 is provided for supplying a cleaning liquid or a rinse liquid (pure water) onto the top surface of the substrate W held by the spin chuck 61. The liquid discharge nozzle 71 is connected to a supply pipe 72, and the cleaning liquid and the rinse liquid are selectively supplied to the liquid discharge nozzle 71 through this supply pipe 72.

In the scrub cleaning processing, the motor 64 rotates the rotation shaft 65. Thus, the arm 66 turns within a horizontal plane, and the brush cleaner 70 moves between a position outside the substrate W and a position above the center of the substrate W, centered around the rotation shaft 65. A lifting mechanism (not shown) is provided in the motor 64. The lifting mechanism lifts and lowers the brush cleaner 70 in the position outside the substrate W and the position above the center of the substrate W by lifting and lowering the rotation shaft 65.

When the scrub cleaning processing is started, the substrate W with the top surface thereof directed upward is rotated by the spin chuck 61. Moreover, the cleaning liquid or the rinse liquid is supplied to the liquid discharge nozzle 71 through the supply pipe 72. Thus, the cleaning liquid or the rinse liquid is supplied onto the top surface of the substrate W that rotates. In this state, the brush cleaner 70 is swung and moved up and down by the rotation shaft 65 and the arm 66. Accordingly, the scrub cleaning processing is performed on the top surface of the substrate W. Note that since the suction-type spin chuck 61 is used in the top surface cleaning unit SS, the peripheral portion and the outer circumference of the substrate W can be simultaneously cleaned.

Next, for the back surface cleaning unit SSR, different points from the top surface cleaning unit SS of FIG. 9 are described with reference to FIG. 10.

As shown in FIG. 10, the back surface cleaning unit SSR includes a mechanical type spin chuck 81 that holds the outer circumference of the substrate W instead of the suction-type spin chuck 61 that holds the lower surface of the substrate W by vacuum suction. When the scrub cleaning processing and the rinsing processing are performed, the substrate W is rotated while being maintained in a horizontal posture with the peripheral portion of the lower surface of the substrate W and the outer circumference of the substrate W held by the spin holding pins 82 on the spin chuck 61.

The substrate W with the back surface thereof directed upward is carried into the back surface cleaning unit SSR. Therefore, the substrate W is held by the spin chuck 81 with the back surface thereof directed upward. Then, a scrub cleaning processing that is similar to the above-described scrub cleaning processing is performed on the back surface of the substrate W.

(1-9) Effects of the First Embodiment (1-9a)

As described above, the reversing units RT1, RT2 are provided in an intermediate position between the indexer robot IR and the main robot MR in the present embodiment. Thus, when the back surface cleaning processing and the top surface cleaning processing are performed on the substrate W, the main robot MR performs four transporting processes for the single substrate W, that is, a transporting process from the reversing unit RT1 to the back surface cleaning unit SSR, a transporting process from the back surface cleaning unit SSR to the reversing unit RT1, a transporting process from the reversing unit RT1 to the top surface cleaning unit SS and a transporting process from the top surface cleaning unit SS to the reversing unit RT2.

In addition, when the substrate W is subjected to the back surface cleaning processing, the main robot MR performs two transporting processes for the single substrate W, that is, a transporting process from the reversing unit RT1 or RT2 to the back surface cleaning unit SSR and a transporting process from the back surface cleaning unit SSR to the reversing unit RT1 or RT2.

As described above, the number of the transporting processes of the main robot MR is reduced, so that the throughput of the substrate processing can be improved.

(1-9b)

Moreover, the reversing unit RT1 is used in transfer of the substrate W before the back surface cleaning processing from the indexer robot IR to the main robot MR, and the reversing unit RT2 is used in transfer of the substrate W after the top surface cleaning processing from the main robot MR to the indexer robot IR in the present embodiment. This prevents the substrate W after the cleaning processing from being contaminated by the substrate W before the cleaning.

(1-9c)

Furthermore, since the reversing unit RT2 is used as an interface for the substrate W after the top surface cleaning processing for the indexer robot IR, a new interface is not required to be provided in the substrate processing apparatus 100 in the present embodiment. This reduces the production cost of the substrate processing apparatus 100.

(1-9d)

In addition, according to the present embodiment, the reversing units RT1, RT2 are provided in the intermediate position between the indexer robot IR and the main robot MR while the plurality of back surface cleaning units SSR and the plurality of top surface cleaning units SS are arranged in multiple stages, respectively, with the main robot MR provided therebetween in the processing block 11 of the substrate processing apparatus 100. This can significantly reduce the substrate processing apparatus 100 in size and space compared to the case where the plurality of cleaning units are arranged in two dimensions and the reversing units are arranged on the side opposite to the indexer robot IR with the main robot MR positioned therebetween.

(1-9e)

Moreover, in the present embodiment, providing the plurality of top surface cleaning units SS and the plurality of back surface cleaning units SSR so as to be stacked in respective multiple stages in the height direction allows the configuration of the substrate processing apparatus 100 (a configuration of a so-called platform) to be reduced in size while disposing the top surface cleaning units SS and the back surface cleaning units SSR in the above-mentioned height direction allows the respective required numbers of top surface cleaning units SS and back surface cleaning units SSR to be easily provided.

(1-9f)

Furthermore, the reversing unit RT1, RT2 reverses the substrate W around the horizontal axis HA that is perpendicular to the line connecting a transfer position of the substrate W by the indexer robot IR and a transfer position of the substrate W by the main robot MR in the present embodiment. This allows the substrate W to be received and transferred between the indexer robot IR and the reversing unit RT1, RT2, and allows the substrate W to be received and transferred between the main robot MR and the reversing unit RT1, RT2 without moving the reversing unit RT1, RT2. Accordingly, the configurations of the reversing units RT1, RT2 are simplified while the reversing units RT1, RT2 are reduced in size.

(1-9g)

In addition, the two substrates W are simultaneously carried into the reversing units RT1, RT2 by the hands IRH1, IRH2 of the indexer robot IR or the hands MRH1, MRH2 of the main robot MR, and simultaneously reversed by the reversing units RT1, RT2 in the present embodiment. Moreover, the two substrates W are simultaneously carried out of the reversing units RT1, RT2 by the hands IRH1, IRH2 of the indexer robot IR or the hands MRH1, MRH2 of the main robot MR.

By the configuration described above, the substrates W can be carried into and out of the reversing units RT1, RT2 quickly while the plurality of substrates W can be reversed efficiently. This allows the throughput of the substrate processing to be improved.

(1-9h)

Furthermore, when the hand MRH2 of the main robot MR is withdrawn to carry the substrate W after the reversing out of the reversing unit RT1, the hand MRH1 of the main robot MR is advanced at the constant level without being vertically moved, so that the substrate W before the reversing can be carried into the reversing unit RT1 in the present embodiment.

In this case, since the heights of the hands MRH1, MRH2 are not required to be adjusted during the period from carrying the substrate W out of the reversing unit RT1 to carrying the substrate W into the reversing unit RT1, the substrate W can be carried into and out of the reversing unit RT1 quickly. Accordingly, the throughput of the substrate processing can be improved.

(2) Second Embodiment (2-1) Configuration of Substrate Processing Apparatus

Figure 11:
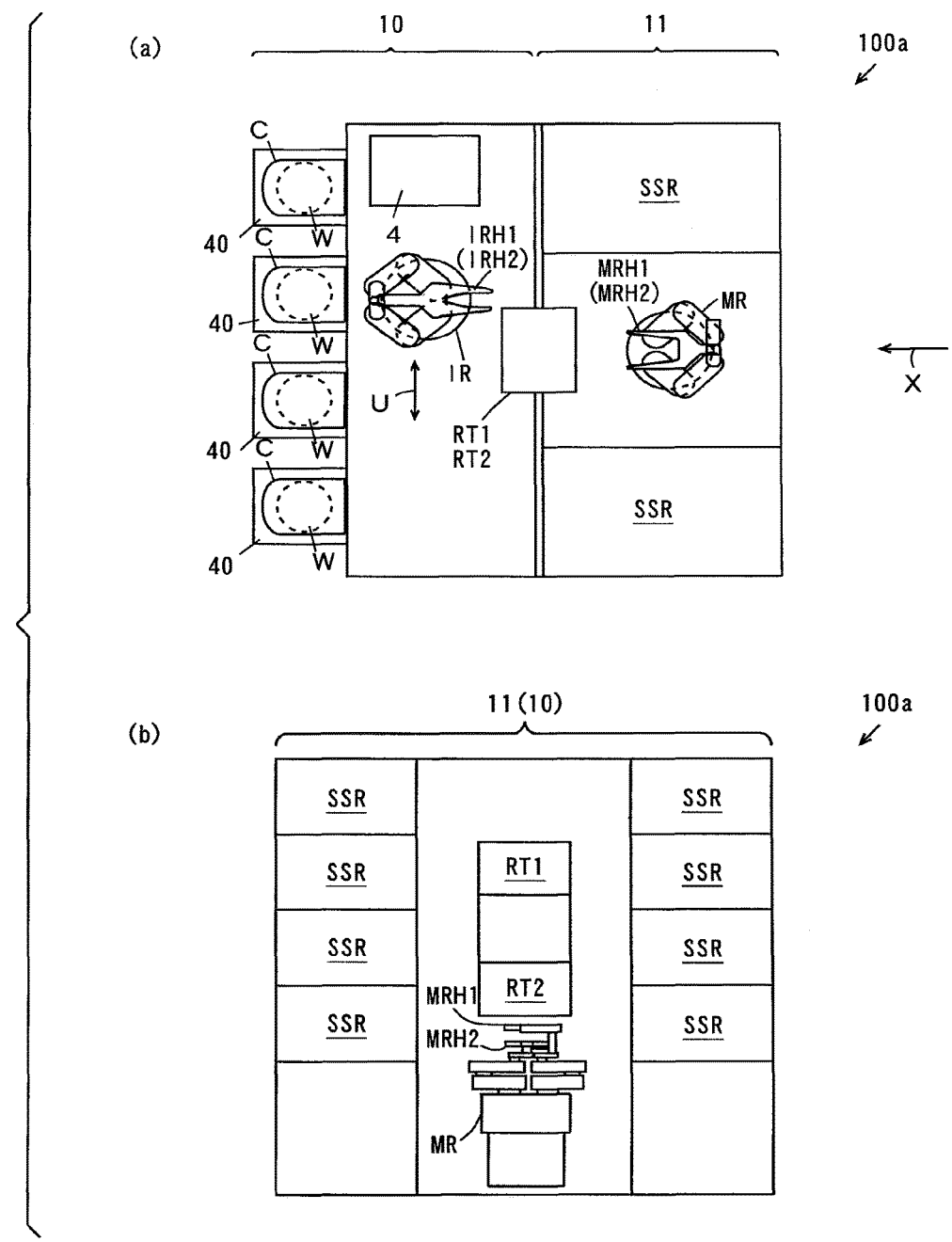
FIG. 11 is a schematic view showing a configuration of a substrate processing apparatus according to a second embodiment.

FIG. 11 is a schematic view showing a configuration of a substrate processing apparatus according to a second embodiment. FIG. 11 (a) is a plan view of the substrate processing apparatus, and FIG. 11 (b) is a side view in which the substrate processing apparatus of FIG. 11 (a) is seen from the direction of the arrow X.

As shown in FIG. 11 (a), the configuration of the substrate processing apparatus 100a according to the present embodiment is different from the configuration of the substrate processing apparatus 100 according to the first embodiment in that the back surface cleaning units SSR are provided in the region where the top surface cleaning units SS are supposed to be provided (FIG. 1) in the processing block 11. That is, twice as many the back surface cleaning units SSR (eight units) as those of the substrate processing apparatus 100 are provided in the substrate processing apparatus 100a.

(2-2) Effects of the Second Embodiment

As described above, the plurality of back surface cleaning units SSR are provided in the processing block 11, so that the throughput of the back surface cleaning processing of the substrate W can be remarkably improved in addition to each of the effects described in the above first embodiment. Specifically, this allows the main robot MR to perform the two transporting processes for the single substrate W, that is, the transporting process from the reversing unit RT1 or RT2 to the back surface cleaning unit SSR and the transporting process from the back surface cleaning unit SSR to the reversing unit RT1 or RT2. Thus, the throughput of the substrate processing in the substrate processing apparatus 100a can be improved.

(3) Other Embodiments

While the case where the top surface cleaning processing of the substrate W is performed after the back surface cleaning processing of the substrate W is explained as an example in the above-described first embodiment, the present invention is not limited to this and the back surface cleaning processing of the substrate W may be performed after the top surface cleaning processing of the substrate W. In this case, the substrate W is not reversed by the reversing unit RT1 before being subjected to the top surface cleaning processing, and reversed by the reversing unit RT2 after the back surface cleaning processing so that the top surface thereof is directed upward.

While the top surface and the back surface of the substrate W are cleaned by using the brush in the top surface cleaning unit SS and the back surface cleaning unit SSR in the above-described embodiments, the present invention is not limited to this and the top surface and the back surface of the substrate W may be cleaned by using a chemical liquid.

In addition, while the reversing unit RT1 reverses the substrate W before the back surface cleaning processing and reverses the substrate W after the back surface cleaning processing in the above-described embodiments, the present invention is not limited to this and the reversing unit RT2 may reverse the substrate W before the back surface cleaning processing and may reverse the substrate W after the back surface cleaning processing. In this case, the substrate W is carried into the reversing unit RT1 after being subjected to the back surface cleaning processing and subsequently to the top surface cleaning processing.

As described above, the control operation in the substrate processing apparatus can be suitably set so that the reversing operations of the substrate W after and before each of the processes can be performed by one of the reversing unit RT1 and the reversing unit RT2 or both of them.

Moreover, while the substrate W is carried into the reversing unit RT1 by the hand MRH1 of the main robot MR and the substrate W is carried out of the reversing unit RT1 by the hand MRH2 of the main robot MR in the above-described embodiments, the present invention is not limited to this and the substrate W may be carried into the reversing unit RT1 by the hand MRH2 and the substrate W may be carried out of the reversing unit RT1 by the hand MRH1.

Furthermore, the main robot MR carries the substrate W after the reversing out of the reversing unit RT1 and subsequently carries the substrate W before the reversing into the reversing unit RT1 in the above-described embodiments, the present invention is not limited to this and the main robot MR may carry the substrate W before the reversing into the reversing unit RT1 and subsequently carry the substrate W after the reversing out of the reversing unit RT1.

In addition, while the support pins 39a, 39b, 39c, 39d have the same length in the above-described embodiments, the length of each of the support pins 39a, 39b, 39c, 39d can be arbitrarily set within a range where the distance between the tips of the support pins 39c and the tips of the support pins 39d is larger than the difference M1 in height between the hand MRH1 and the hand MRH2 and a distance between the tips of the support pins 39a and the tips of the support pins 39b is smaller than the difference M1 in height between the hand MRH1 and the hand MRH2 with the first movable plate 36a and the second movable plate 36b being farthest away from the fixed plate 32.

Furthermore, while multi-joint type transport robots that linearly move their hands forward and backward by moving their joints are used as the indexer robot IR and the main robot MR in the above-described embodiments, the present invention is not limited to this and linear-type transport robots that move their hands forward and backward by linearly sliding them with respect to the substrate W may be used.

In addition, one or plurality of substrate platforms for temporarily placing the substrate W may be provided between the reversing unit RT1 and the reversing unit RT2. In this case, unlike the above-described embodiments, the main robot MR does not carry the substrate W after the top surface cleaning processing into the reversing unit RT2, and places it on the above-mentioned substrate platform. Such a configuration allows the new substrate W to be carried into the reversing unit RT2 from the carrier C by the indexer robot IR instead of carrying the substrate W after the top surface cleaning processing into the reversing unit RT2.

Moreover, the order of the operations of the indexer robot IR and the main robot MR may be suitably changed depending on the processing speeds of the reversing units RT1, RT2, the top surface cleaning unit SS and the back surface cleaning unit SSR.

Furthermore, the respective numbers of the reversing units RT1, RT2, the top surface cleaning unit SS and the back surface cleaning unit SSR may be suitably changed depending on their processing speeds.

(4) Correspondences Between Structural Elements in Claims and Elements in the Embodiments In the following paragraphs, non-limiting examples of correspondences between various elements recited in the claims below and those described above with respect to various embodiments of the present invention are explained.

In the above-described embodiments, the indexer block 10 is an example of a carrying in and out region, the processing block 11 is an example of a processing region, the carrier C is an example of a storing container, the carrier platform 40 is an example of a container platform, the indexer robot IR is an example of a first transport device, the main robot MR is an example of a second transport device, the back surface cleaning unit SSR is an example of a first cleaning processing unit and a first cleaning unit, the top surface cleaning unit SS is an example of a second cleaning processing unit and a second cleaning unit and the horizontal axis HA is an example of a rotation axis.

In addition, the reversing units RT1, RT2 are examples of first and second reversing devices, respectively, the fixed plate 32, the first movable plate 36a, the support pins 39a, 39c and the cylinder 37a are examples of a first holding mechanism, the fixed plate 32, the second movable plate 36b, the support pins 39b, 39d and the cylinder 37b are examples of a second holding mechanism, the support plate 31 is an example of a support member and the rotary actuator 38 is an example of a rotating device in the above-described embodiments.

Furthermore, the fixed plate 32 is an example of a common reverse holding member, the first movable plate 36a is an example of a first reverse holding member, the second movable plate 36b is an example of a second reverse holding member, the support pin 39a is an example of a first supporter, the support pin 39c is an example of a second supporter, the support pin 39b is an example of a third supporter, the support pin 39d is an example of a fourth supporter, the cylinder 37a is an example of a first driving mechanism, the cylinder 37b is an example of a second driving mechanism, a hand MRH1 is an example of a first transport holder and the hand MRH2 is an example of a second transport holder in the above-described embodiments.

Note that as each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing method that subjects first and second substrates to processing by a substrate processing apparatus including a carrying in and out region that includes a container platform and a first transport device, a processing region that includes first and second back surface processing units, first and second top surface processing units, and a second transport device, and first and second reversing devices provided separately from each other between said processing region and said carrying in and out region, wherein
said first and second reversing devices are provided one above another,
said first reversing device is configured to reverse the first and second substrates simultaneously around a first horizontal axis,
said second reversing device is configured to reverse the first and second substrates simultaneously around a second horizontal axis that is spaced vertically from the first horizontal axis,
a storing container placed on said container platform stores the first and second substrates having top surfaces directed upward,
said method comprising the steps of:
taking the first and second substrates before the processing with the top surfaces being directed upward out of said storing container, and carrying the first and second substrates simultaneously into said first reversing device, by said first transport device;
reversing the first and second substrates before the processing from a state where the top surfaces of the first and second substrates are directed upward to a state where the top surfaces of the first and second substrates are directed downward simultaneously in said first reversing device;
carrying the first and second substrates before the processing simultaneously out of said first reversing device by said second transport device while keeping the top surfaces of the first and second substrates being directed downward;
carrying the first substrate carried out of said first reversing device into said first back surface processing unit and also carrying the second substrate carried out of said first reversing device to a position close to the first back surface processing unit by said second transport device while keeping the top surfaces of the first and second substrates being directed downward;
transporting the second substrate from the position close to said first back surface processing unit to a position close to said second back surface processing unit by said second transport device while keeping the top surface of the second substrate being directed downward;
carrying the second substrate transported to the position close to said second back surface processing unit into said second back surface processing unit by said second transport device;

processing a back surface of the first substrate while holding the first substrate with the back surface being directed upward in said first back surface processing unit, and processing a back surface of the second substrate while holding the second substrate with the back surface being directed upward in said second back surface processing unit;

carrying the first substrate after the back surface processing out of said first back surface processing unit, and carrying the second substrate after the back surface processing out of said second back surface processing unit, by said second transport device;

carrying the first and second substrates after the back surface processing simultaneously into said first or second reversing device by said second transport device;

reversing the first and second substrates after the back surface processing simultaneously from a state where the top surfaces of the first and second substrates are directed downward to a state where the top surfaces of the first and second substrates are directed upward in said first or second reversing device;

carrying the first and second substrates after the back surface processing simultaneously out of said first or second reversing device by said second transport device;

carrying the first substrate after the back surface processing carried out of said first or second reversing device into said first top surface processing unit, and carrying the second substrate after the back surface processing carried out of said first or second reversing device into said second top surface processing unit, by said second transport device;

processing the top surface of the first substrate while holding the first substrate with the top surface being directed upward in said first top surface processing unit, and processing the top surface of the second substrate while holding the second substrate with the top surface being directed upward in said second top surface processing unit;

carrying the first substrate after the top surface processing out of said first top surface processing unit and carrying the second substrate after the top surface processing out of said second top surface processing unit, by said second transport device;

carrying the first and second substrates after the top surface processing simultaneously into said second reversing device by said second transport device; and carrying the first and second substrates after the top surface processing simultaneously out of said second reversing device, and storing the carried out first and second substrates in said storing container placed on said container platform, by said first transport device.

2. The substrate processing method according to claim 1, wherein said first back surface processing unit includes a first back surface cleaning unit that cleans the back surface of the first substrate, and said second back surface processing unit includes a second back surface cleaning unit that cleans the back surface of the second substrate.

3. The substrate processing method according to claim 1, wherein said first top surface processing unit includes a first top surface cleaning unit that cleans the top surface of the first substrate, and said second top surface processing unit includes a second top surface cleaning unit that cleans the top surface of the second substrate.

4. The substrate processing method according to claim 1, wherein each of said first and second reversing devices reverses the first and second substrates around a rotation axis that crosses a line connecting a position of said first transport device in receiving and transferring the first and second substrates and a position of said second transport device in receiving and transferring the first and second substrates.

5. The substrate processing method according to claim 1, wherein each of said first and second reversing devices is provided with
a first holding mechanism that holds the first substrate perpendicularly to a first axis,
a second holding mechanism that holds the second substrate perpendicularly to said first axis,
a support member that supports said first and second holding mechanisms so that said first and second holding mechanisms overlap with each other in a direction of said first axis, and
a rotating device that integrally rotates said support member together with said first and second holding mechanisms around a second axis that is substantially perpendicular to said first axis and wherein
said first holding mechanism holds the first substrate independently from said second holding mechanism, and said second holding mechanism holds the second substrate independently from said first holding mechanism.

6. The substrate processing method according to claim 5, wherein
said second transport device is provided with first and second transport holders,
said first holding mechanism supports the first substrate at a first support position in the direction of said first axis in carrying in or out the first substrate, and holds the first substrate at a first holding position in the direction of said first axis in reversing the first substrate,
said second holding mechanism supports the second substrate at a second support position in the direction of said first axis in carrying in or out the second substrate, and holds the second substrate at a second holding position in the direction of said first axis in reversing the second substrate, and
a distance between said first support position in said first holding mechanism and said second support position in said second holding mechanism is set to be substantially equal to a distance between a holding position of the first substrate by said first transport holder of said second transport device and a holding position of the second substrate by said second transport holder.

7. The substrate processing method according to claim 1, wherein
the step of reversing the first and second substrates before the processing in said first reversing device includes simultaneously and integrally reversing the first and second substrates before the processing in said first reversing device independently and separately from an operation of said second reversing device.

* * * * *